United States Patent [19]

Tanaka et al.

[11] Patent Number: 4,468,607
[45] Date of Patent: Aug. 28, 1984

[54] LADDER-TYPE SIGNAL ATTENUATOR

[75] Inventors: Kouji Tanaka; Susumu Yamada, both of Gunma, Japan

[73] Assignees: Sanyo Electric Co., Ltd.; Tokyo Sanyo Electric Co., Ltd., both of Japan

[21] Appl. No.: 374,886

[22] Filed: May 4, 1982

[30] Foreign Application Priority Data

May 7, 1981 [JP] Japan ................................. 56-69180
May 7, 1981 [JP] Japan ................................. 56-69181
Jun. 3, 1981 [JP] Japan ................................. 56-85991

[51] Int. Cl.³ ....................... H03H 7/26; H03K 13/02
[52] U.S. Cl. ................................ 323/354; 333/81 R; 455/249; 340/347 DA
[58] Field of Search ............................. 323/297–298, 323/352–354; 340/347 CC, 347 AD, 347 DA; 330/284; 333/81 R; 307/540, 552, 557; 455/232, 249; 338/200, 201

[56] References Cited

U.S. PATENT DOCUMENTS

| | | | |
|---|---|---|---|
| 3,590,366 | 6/1971 | Vaughn | 333/81 R |
| 3,728,719 | 4/1973 | Fish | 340/347 DA |
| 3,858,128 | 12/1974 | Mullin | 333/81 R |
| 3,898,593 | 8/1975 | Qureshi | 323/354 X |
| 4,150,366 | 4/1979 | Price | 323/354 X |
| 4,349,811 | 9/1982 | Brokaw | 340/347 DA |
| 4,381,499 | 4/1983 | Struthoff | 340/347 DA |

Primary Examiner—Peter S. Wong
Attorney, Agent, or Firm—Darby & Darby

[57] ABSTRACT

A ladder-type signal attenuator comprises a ladder network (50) storing a ladder resistor circuit of a plurality of stages (n−1) each having an input resistor (2R) and an output resistor (R) and a ladder portion of the final stage (n) having an input resistor (8) and an output resistor (7) and coupled to the ladder resistor circuit. The resistance value (RB) of the input resistor (8) of the ladder portion of the final stage is different from 2R and/or the resistance value (RA) of the output resistor (7) is different from R. A bias voltage (Vb) or an analog input signal (Sin) is selectively applied to a corresponding signal input terminal of the ladder circuit (50) by means of switches ($S_1$ to $S_n$) in response to control data ($b_1$ to $b_n$) of n bits. At least one of the resistance values of the two resistors (7, 8) of the final stage ladder portion is changed as a function of the state "0" or "1" of the final bit ($b_n$) of the control data, whereby the ratio of the output to the input of the ladder-type signal attenuator with respect to the control data is approximated in a polygonal line manner to a desired curve.

17 Claims, 21 Drawing Figures

LADDER-TYPE SIGNAL ATTENUATOR

BACKGROUND OF THE INVENTION

1. Field of the Invention

The present invention generally relates to a ladder-type signal attenuator. More specifically, the present invention relates to a ladder-type signal attenuator employing an R-2R-type ladder resistor network and adapted for attenuating an analog signal under control by digital data to be a predetermined ratio of output/input.

2. Description of the Prior Art

FIG. 1 is a schematic diagram showing one example of a signal attenuator employing a conventional R-2R-type ladder resistor network which constitutes the background of the invention. An input terminal 1 is supplied with an analog input signal Sin and another input terminal 2 is supplied with a bias voltage Vb. The ladder network 5 comprises a plurality of stages, and in the embodiment shown, n stages, each having a combination of an input resistor 2R and an output resistor R. A switch circuit 4 comprises switches $S_1$ to $S_n$ corresponding to signal input terminals of the respective stages of the ladder network 5 and is adapted to be controlled in response to digital control data obtained from a control data generator 3. More specifically, the respective switches $S_1$ to $S_n$ are provided to selectively supply an analog input signal Sin or a bias voltage Vb to the corresponding signal input terminals of the ladder network 5 in response to the state of the bits $b_1$ to $b_n$ of the control data. An output signal Scout associated with the ratio of the output to the input determinable by the digital control data is obtained at an output terminal 6 from the ladder network 5.

As well known, in a signal attenuator employing an R-2R-type ladder resistor network, the ratio of the output (Scout−Vb) to the input (Sin−Vb) is expressed by the following equation (1).

$$\frac{Sout - Vb}{Sin - Vb} = \frac{1}{2^n}(b_1 + 2b_2 + \ldots + 2^{n-1} \cdot b_n) \quad (1)$$

where $b_1, b_2, \ldots b_n$ are the control data obtained from the control data generator 3 and supplied to the switches $S_1, S_2, \ldots S_n$, respectively, shown in FIG. 1, and each assumes "0" or "1". More specifically, $(b_1 + 2b_2 + \ldots + 2^{n-1} \cdot b_n)$ in the equation (1) represents the control data, i.e. the decimal values with respect to the binary codes $(b_1, b_2, \ldots, b_n)$ and the same are in succession incremented as $0, 1, 2, \ldots, 2^{n-1}$ by changing in succession the binary codes $(b_1, b_2, \ldots, b_n)$. Accordingly, (Scout−Vb)/(Sin−Vb) in the equation (1) becomes a straight line which changes at the pitches of $1/2^n$, as shown in FIG. 2.

On the other hand, such a variable resistor or a signal attenuator as shown in FIG. 3A, for example, is employed for volume adjustment, tone adjustment or balance adjustment in audio equipment and such a signal attenuator has a relation between the revolution angle of an adjusting knob and the output that can assume any one of curves A to E shown in FIG. 3B. Thus, volume adjustment of audio equipment requires a signal attenuator having such a characteristic of A curve or D curve as shown in FIG. 3B. However, a conventional signal attenuator employing a R-2R-type ladder resistor network could not achieve a characteristic of such A curve or D curve.

Furthermore, such a conventional signal attenuator as shown in FIG. 3A was suited for volume adjustment in audio equipment, for example, inasmuch as generally the larger the attenuation amount the smaller the output impedance thereof. However, such a signal attenuator employing an R-2R-type network as shown in FIG. 1 exhibits an output impedance which is approximately constant not withstanding a change in the attenuation amount. This means that the noise level at the output of the signal attenuator due to a thermal noise, for example, is constant and thus the noise level increases relatively to the signal as the attenuation amount of the signal increases, resulting in reduction of the signal to noise ratio. Such is extremely disadvantageous as compared with a conventional variable resistor-type attenuator in the case where such signal attenuator is utilized for volume adjustment in particular.

SUMMARY OF THE INVENTION

Accordingly, a principal object of the present invention is to provide a ladder-type signal attenuator which is controlled with digital control data, particularly suited for volume adjustment of audio equipment, for example.

Briefly, a ladder-type signal attenuator in accordance with the present invention comprises a ladder network having R-2R-type ladder resistor circuit of (n−1) stages and a ladder portion of the final stage (n) connected thereto, wherein the input resistor and/or the output resistor of the final stage ladder portion are selected such that the resistance values thereof are different from 2R and/or R and the resistance value of at least one of the input resistor and the output resistor of the final stage ladder portion is changed in response to the final bit state of the control data.

According to the present invention, a desired curve can be attained in a polygonal line approximated manner with a simple structure in which the resistance values of the input resistor and/or the output resistor of the final stage of a conventional R-2R-type ladder resistor network is changed in response to the state of the final bit of the control data.

Since the ladder circuit up to the (n−1) stage comprises the R-2R-type resistor network and the composite resistance value up to the (n−1) stage amounts to R of the constant value, it is possible to change an unit output changing amount, i.e. a gradient of the output/input with respect to the control data, by changing the resistance value (RB, RA) of at least one of the input resistor and the output resistor of the final stage ladder portion.

According to the present invention, by changing the resistance value of at least one of the input resistor and output resistor of the final stage ladder portion in response to an increase of step numbers of the control data while the final bit of the control data remains "0" or "1" and by changing the control data into the value different from the value to be made next, the gradient of the output/input with respect to the step numbers of said control data is changed in accordance with the increase of the steps. Furthermore, by changing the resistance value of the input resistor and/or output resistor of the final stage ladder portion when the final bit of the control data changes from "0" to "1", more accurate polygonal line approximation of a desired curve can be achieved.

In a preferred embodiment of the present invention, the input resistor of the final stage ladder portion comprises a plurality of resistors connected in series, with the respective switches interposed in parallel between the respective series connection junctions and the signal output terminal, such that these switches are each selectively turned on or off in response to further control data generated in accordance with an increase of the step numbers of the control data. According to the embodiment in discussion, the gradient of the ratio of the output to the input with respect to step numbers of the control data can be arbitrarily selected through switching of these switches and therefore polygonal line approximation of a desired curve can be achieved and the output impedance can be decreased as the attenuation amount is decreased and, therefore, the signal to noise ratio is not degraded even in the case of a large attenuation amount, when the embodiment is utilized as a signal attenuator for volume adjustment of audio equipment.

Meanwhile, the invention may be embodied such that the input resistor of the final stage ladder portion is implemented by a plurality of parallel resistors and any one or more of these plurality of resistors are selectively rendered effective as a function of an increase of step numbers of the control data.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 4:
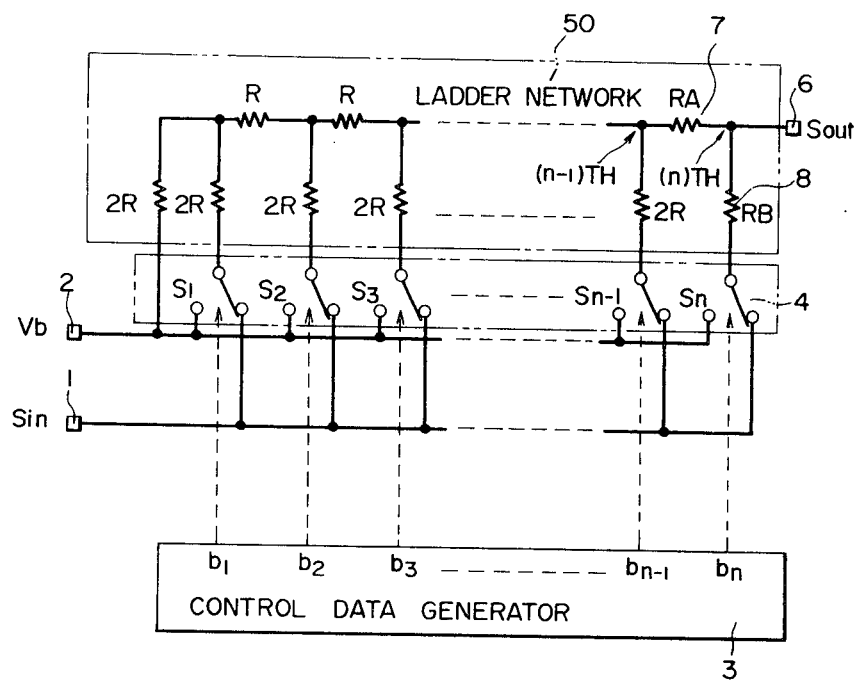
FIG. 4 is a schematic diagram of one embodiment in accordance with the present invention.

FIG. 4 is a schematic diagram showing one embodiment of the present invention. The FIG. 4 embodiment is similar to the FIG. 1 conventional example, excluding a ladder network 50. The embodiment shown comprises the ladder network 50 implemented by an ordinary R-2R-type ladder resistor circuit up to the $(n-1)$ stage and the $n-$th stage or the final stage ladder portion implemented by resistors 7 and 8, the resistance values of which are selected to be RA and RB, respectively, which are different from R or 2R. More specifically, the resistance value RA of the output resistor 7 constituting the final stage ladder portion is selected to be different from R and/or the resistance value RB of the input resistor 8 is selected to be different from 2R.

Figure 5:
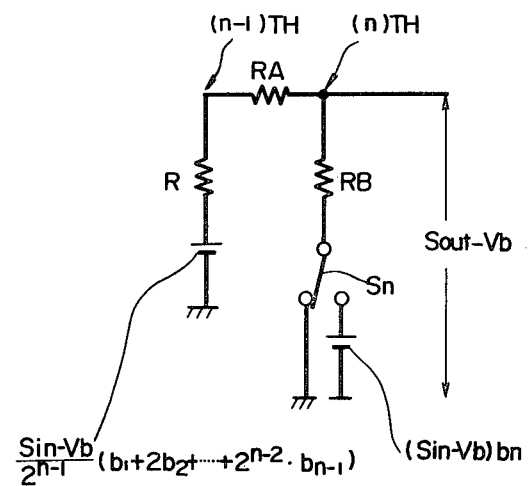
FIG. 5 is an equivalent diagram for explaining the FIG. 4 embodiment.

The FIG. 4 embodiment may be represented as shown in the FIG. 5 equivalent diagram. Accordingly, the ratio of the output to the input in the FIG. 4 embodiment is expressed by the following equation (2) when the above described equivalent conversion is relied upon.

$$\frac{Sout - Vb}{Sin - Vb} = \frac{1}{2^{n-1}}(b_1 + 2b_2 + \ldots + 2^{n-2} \cdot b_{n-1})\frac{RB}{R + RA + RB} + b_n \frac{R + RA}{R + RA + RB} \quad (2)$$

where the coefficient $b_n$ in the parenthesized portion in the first term and in the second term in the right side represents the respective bit outputs $b_1, b_2, \ldots b_n$ of the control data obtained from the control data generator 3. The control data is changeable as shown in TABLE I.

TABLE I

| control data (step number) | $b_1$ | $b_2$ | $b_3$ | ... | $b_{n-1}$ | $b_n$ |
|---|---|---|---|---|---|---|
| 0 | 0 | 0 | 0 | ... | 0 | 0 |
| 1 | 1 | 0 | 0 | ... | 0 | 0 |
| 2 | 0 | 1 | 0 | ... | 0 | 0 |
| . | . | . | . |   | . | . |
| $2^{n-1}-1$ | 1 | 1 | 1 | ... | 1 | 0 |
| $2^{n-1}$ | 0 | 0 | 0 | ... | 0 | 1 |
| . |   |   |   |   |   |   |
| $2^n-1$ | 1 | 1 | 1 | ... | 1 | 1 |

Figure 6:
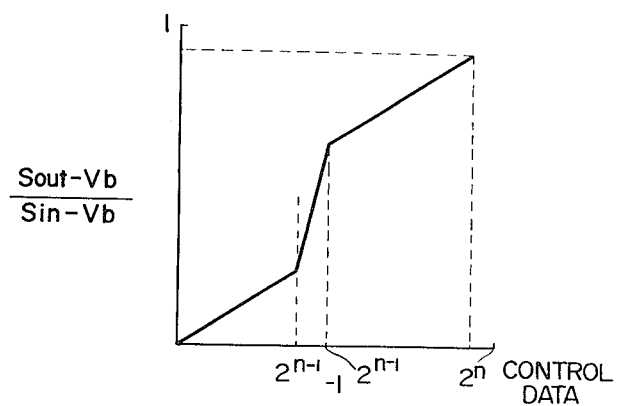
FIG. 6 is a graph showing one example of a signal attenuation characteristic for explaining the FIG. 4 embodiment.

Thus, by changing the order of the control data, the ratio of the output to the input changes along the straight line as shown in FIG. 6 in accordance with the equation (2). Assuming that a polygonal line through four points which have the values 0, $\{(2^{n-1}-1)/2^{n-1}\}\cdot\{RB/(R+RA+RB)\}$, $(R+RB)/(R+RA+RB)$ and $\{1-(1/2^{n-1})\}\cdot\{RB/(R+RA+RB)\}$ of the ratio (Sout−Vb)/(Sin−Vb) when the step numbers of the control data are 0, $2^{n-1}-1$, $2^{n-1}$ and $2^n-1$ is formed, the polygonal line has a gradient of $(1/2^{n-1})\cdot\{RB/(R+RA+RB)\}$ in the period where the step number of the control data is changed from 0 to $2^{n-1}$ and from $2^{n-1}$ to $2^n-1$, respectively. However, when the final bit $b_n$ of the control data changes from "0" to "1", i.e. when the control data changes from $2^{n-1}-1$ to $2^{n-1}$, the ratio of the output to the input abruptly changes from $\{(2^{n-1}-1)/2^{n-1}\}\cdot\{RB/(R+RA+RB)\}$ to $(R+RA)/R+RA+RB)$, as shown in FIG. 6, as is clear from the equation (2).

Figure 7:
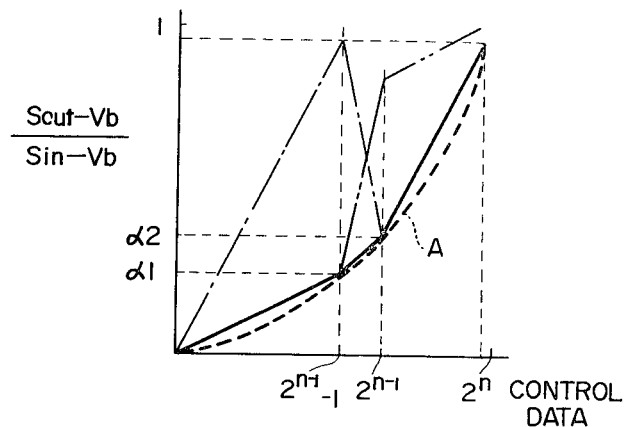
FIG. 7 is a graph showing one example of a signal attenuation characteristic for polygonal line approximation to a desired curve in accordance with the present invention.

Therefore, in the embodiment shown in order to eliminate such abrupt change of the ratio of the output to the input when the final bit $b_n$ of the control data changes from "0" to "1", thereby to obtain such a signal attenuation characteristic as shown in FIG. 7, it is adapted such that the resistance values RA and/or RB of the output resistor 7 and/or the input resistor 8 constituting the final stage ladder portion may be changed as a function of the state of the final bit $b_n$ of the control data. More specifically, the embodiment shown is adapted such that the resistance values of the resistors 7 and 8 of the final stage of the R-2R-type ladder network are selected to be the resistance values RA and RB which are different from R and 2R and the resistance values RA and/or RB are changed depending on "0" or "1" of the final bit of the control data, whereby polygonal line approximation as shown in FIG. 7 is attained.

Thus, any desired variation characteristic of A-curve to D-curve of a conventional variable resistor-type signal attenuator can be attained in a polygonal line approximation manner. The FIG. 7 example shows a case of a polygonal line approximation of A-curve.

In achieving polygonal line approximation of a desired curve, first a curve to be approximated is determined and the ratio of the output to an arbitrary input in the curve, i.e. (Sout−Vb)/(Sin−Vb) is determined in conjunction with the control data $2^{n-1}-1$ and $2^{n-1}$, as $\alpha1$ and $\alpha2$. Assuming that $RA_{\alpha1}$ and $RB_{\alpha1}$ represent the resistance value of RA and RB in the period where the control data changes from 0 to $2^{n-1}-1$ and that $RA_{\alpha2}$ and $RB_{\alpha2}$ represent the resistance value of RA and RB in the period where the control data changes from $2^{n-1}$ to $2^n-1$, these values $\alpha1$ and $\alpha2$ may expressed by the following equations (3) and (4).

$$\alpha1 = \left(1 - \frac{1}{2^{n-1}}\right) \frac{RB_{\alpha1}}{R + RA_{\alpha1} + RB_{\alpha1}} \quad (3)$$

$$\alpha2 = \frac{R + RA_{\alpha2}}{R + RA_{\alpha2} + RB_{\alpha2}} \quad (4)$$

Accordingly, a polygonal line approximation can be attained with respect to A-curve as shown in FIG. 7, by selecting these resistance values $RA_{\alpha1}$, $RB_{\alpha1}$ and $RA_{\alpha2}$, $RB_{\alpha2}$, such that the above described equations (3) and (4) may be met, and by employing values $RA_{\alpha1}$ and $RB_{\alpha1}$ when the final bit $b_n$ of the control data is "0" and by employing values $RA_{\alpha2}$ and $RB_{\alpha2}$ when the final bit $b_n$ of the control data is "1".

FIGS. 8, 9A, 9B and 10 are schematic diagrams showning specific examples for changing the resistance of the final stage ladder portion depending on "0" or "1" of the final bit $b_n$ of the control data.

Figure 8:
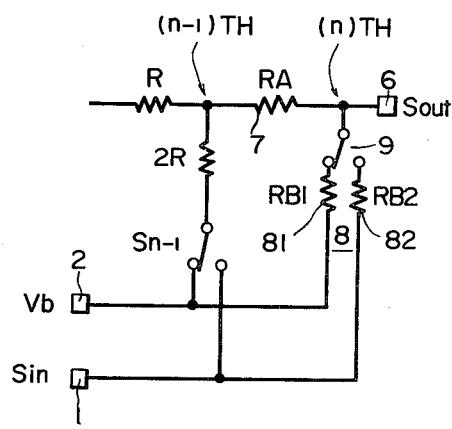
FIGS. 8, 9A, 9B and 10 are schematic diagrams showing different examples of the resistance value changing means.

FIG. 8 is a schematic diagram showing an embodiment adapted for changing the resistance value of the input resistor 8 depending on the state of the final bit $b_n$ of the control data while the resistance value of the output resistor 7 of the final stage ladder portion is maintained constant. More specifically, the FIG. 8 embodiment employs two resistors 81 and 82 as the input resistor of the final stage ladder portion, wherein the resistors 81 and 82 have the resistance values RB1 and RB2, respectively. The embodiment is structured such that any one of the resistors 81 and 82 is selectively rendered effective by means of a switch 9 controlled depending on the state of the final bit $b_n$ of the control data. More specifically, the resistor 81 is employed as the input resistor when the final bit $b_n$ of the control data is "0", whereas the resistor 81 is employed when the final bit $b_n$ of the control data is "1". It is pointed out that the resistance value RB1 corresponds to $RB_{\alpha1}$ of the equation (3) and the resistance value RB2 corresponds to $RB_{\alpha2}$ of the equation (4). Meanwhile, the resistance value RA of the output resistor 7 is constant and accordingly the resistance values $RA_{\alpha1}$ and $RA_{\alpha2}$ of the equations (3) and (4) are represented as the same value RA. Therefore, according to the FIG. 8 embodiment, proper selection of the resistance values RB1 and RB2 makes it possible to achieve a polygonal line approximation as shown in FIG. 7, for example.

Figure 9A:
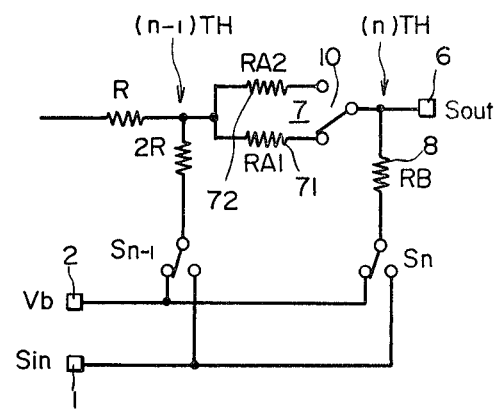

FIG. 9A shows an embodiment adapted for changing the resistance value of the output resistor 7 while the resistance value of the input resistor 8 of the final stage ladder portion is maintained constant. The embodiment shown comprises a switch 10 separately provided to be operable in a ganged fashion with the switch $S_n$ controlled depending on the final bit $b_n$ of the control data. Two resistors 71 and 72 are employed as the output resistor 7 and these resistors 71 and 72 are selected to have the resistance values RA1 and RA2, respectively. Any one of these resistors 71 and 72 is selectively rendered effective by means of the switch 10 depending on the state of the final bit $b_n$ of the control data. More specifically, the resistor 71 having the resistance value RA1 is selected as the output resistor when the final bit $b_n$ of the control data is "0", whereas the resistor 72 having the resistance value RA2 is selected as the output resistor when the final bit $b_n$ of the control data is "1". In the embodiment shown the resistance value RB of the input resistor 8 is maintained constant. Accordingly, the resistance value RA1 corresponds to value $RA_{\alpha1}$ in the equation (3) and the value RA2 corresponds to the value $RA_{\alpha2}$ of the equation (4). The resistance values $RB_{\alpha1}$ and $RB_{\alpha2}$ of the equations (3) and (4) are represented as the same value RB.

Figure 9B:
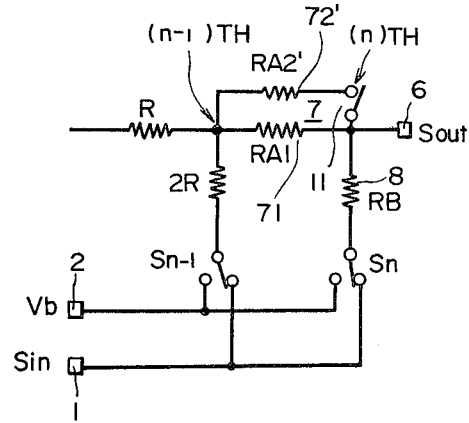

The FIG. 9B embodiment is similar to the FIG. 9A embodiment and is adapted such that the resistance value of the output resistor 7 is changed depending on the content of the final bit $b_n$ of the control data while the resistance value of the input resistor 8 of the final stage ladder portion is maintained constant. The FIG. 9B embodiment is provided with a switch 11 such that the switch 11 is conrollably turned off or on depending on "0" or "1" of the final bit $b_n$ of the control data. Two resistors 71 and 72' having the resistance values RA1 and RA2', respectively, are employed as the output resistor of the final ladder portion. The resistor 72' is connected in parallel with the resistor 71 through the switch 11. The switch 11 is turned off when the final bit $b_n$ of the control data is "0", whereby the resistor 71 is rendered effective as the output resistor to provide the resistance value RA1. The switch 11 is turned on when the final bit $b_n$ is "1", so that a parallel connection of the resistors 71 and 72' are utilized as the output resistor, thereby to provide a parallel resistance value of RA1·RA2'/RA1+RA2'). The resistance value RA1 corresponds to $RA_{\alpha 1}$ of the equation (3) and the resistance value RA1·RA2'/(RA1+RA2') corresponds to $RA_{\alpha 2}$ of the equation (4). $RB_{\alpha 1}$ and $RB_{\alpha 2}$ in the equations (3) and (4) are given as a constant value RB, as in the case of the FIG. 9A embodiment.

Figure 10:
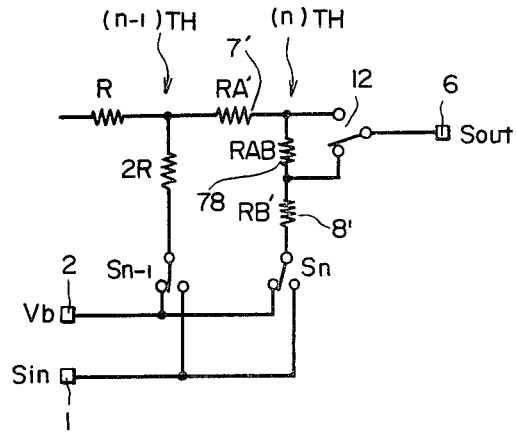

FIG. 10 shows an embodiment adapted for changing both the resistance values of the output resistor and the input resistor of the final stage ladder portion depending on the state of the final bit $b_n$ of the control data. A resistor 78 is interposed between the output resistor 7' and the input resistor 8' of the final stage ladder portion and the resistors 7', 8' and 78 are selected to have the resistance values RA', RB' and RAB, respectively. A switch 12 is connected in parallel with the resistor 78 and the same may be switched in a ganged fashion with the switch $S_n$ depending on the state of the final bit $b_n$ of the control data. Accordingly, when the final bit $b_n$ of the control data is "0", a series connection of the resistors 7' and 78 is utilized as the output resistor, in which the series resistance value is (RA'+RAB) and the resistor 8' is utilized as the input resistor, in which the resistance value of the resistor 8' is RB'. When the final bit $b_n$ is "1", the switch 12 is switched, whereby the resistor 7' having the resistance value RA' is utilized as the output resistor and a series connection of the resistor 8' and 78 is utilized as the input resistor, in which the series resistance value is (RB'+RAB). Accordingly, in the FIG. 10 embodiment, the resistance value (RA'+RAB) corresponds to $RA_{\alpha 1}$ of the equation (3) and the resistance value RB' corresponds to $RB_{\alpha 1}$ of the equation (3). Furthermore, the resistance value (RB'+RAB) corresponds to $RB_{\alpha 2}$ of the equation (4) and the resistance value RA' corresponds to $RA_{\alpha 2}$ of the equation (4). Thus, various approaches may be employed to change the resistance values of the input resistor and/or the output resistor of the final stage ladder portion depending on "0" or "1" of the final bit $b_n$ of the control data. Accordingly, it is possible to determine the ratio of the output to the input (Sout−Vb)/(Sin−Vb), i.e. $\alpha 1$ and $\alpha 2$, in accordance with a desired curve (FIG. 3B) to be approximated in a polygonal line manner and to determine the resistance value $RA_{\alpha 1}$, $RA_{\alpha 2}$, $RB_{\alpha 1}$ and $RB_{\alpha 2}$ accordance with the equations (3) and (4).

Figure 11:
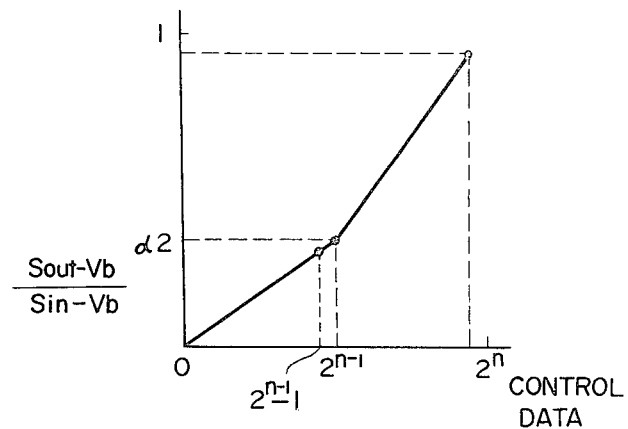
FIG. 11 is a graph showing another example of a signal attenuation characteristic for providing polygonal line approximation in accordance with the FIG. 4 embodiment.

FIG. 11 is a graph showing another example of a polygonal line approximation characteristic attained by the FIG. 4 embodiment. As is different from the FIG. 7 example, the FIG. 11 example achieves a polygonal line approximation characteristic which involves a single bending point. In order to attain the characteristic shown in FIG. 11, following equations (3') or (4') are employed as the previous described equations (3) and (4) are utilized, in which the resistance values are $RA_{\alpha 1}$, $RA_{\alpha 2}$, $RB_2$ are properly selected.

$$\alpha 1 + \frac{1}{2^{n-1}} \cdot \frac{RB_{\alpha 1}}{R + RA_{\alpha 1} + RB_{\alpha 1}} = \alpha 2 \quad (3')$$

$$\alpha 1 = \alpha 2 \frac{-1}{2^{n-1}} \cdot \frac{RB_{\alpha 2}}{R + RA_{\alpha 2} + RB_{\alpha 2}} \quad (4')$$

In the case where the polygonal line involves a single bending point as shown in FIG. 11, the specific values of the resistance value of RA and RB may be selected as follows.

Assuming that $\alpha 2$ is equal to ¼, the resistance values of the resistors 7, 81 and 82 in FIG. 8 embodiment may be selected to have relations RA=R, RB1=2R/3 and RB2=6R, the resistance values of the resistors 71, 72 and 8 in FIG. 9A embodiment may be selected to have relations RA1=11R, RA2=R/3 and RB=4R, the resistance values of the resistors 71, 72' and 8 in FIG. 9B embodiment may be selected to have relations RA1=11R and RA2'=11R/32 and RB=4R, and the resistance values of the resistors 7', 8' and 78 in FIG. 10 embodiment may be selected to have relations RA'=R/4, RAB=10R/4 and RB'=5R/4.

According to the above described embodiments, the resistance value of the input resistor and/or the output resistor of the final stage ladder portion of the ladder network is merely changed depending on the state "0" or "1" of the final bit of the control data, so that a desired polygonal line approximation may be attained, and therefore these embodiments are particularly suited for volume adjustment of audio equipment.

Figure 12:
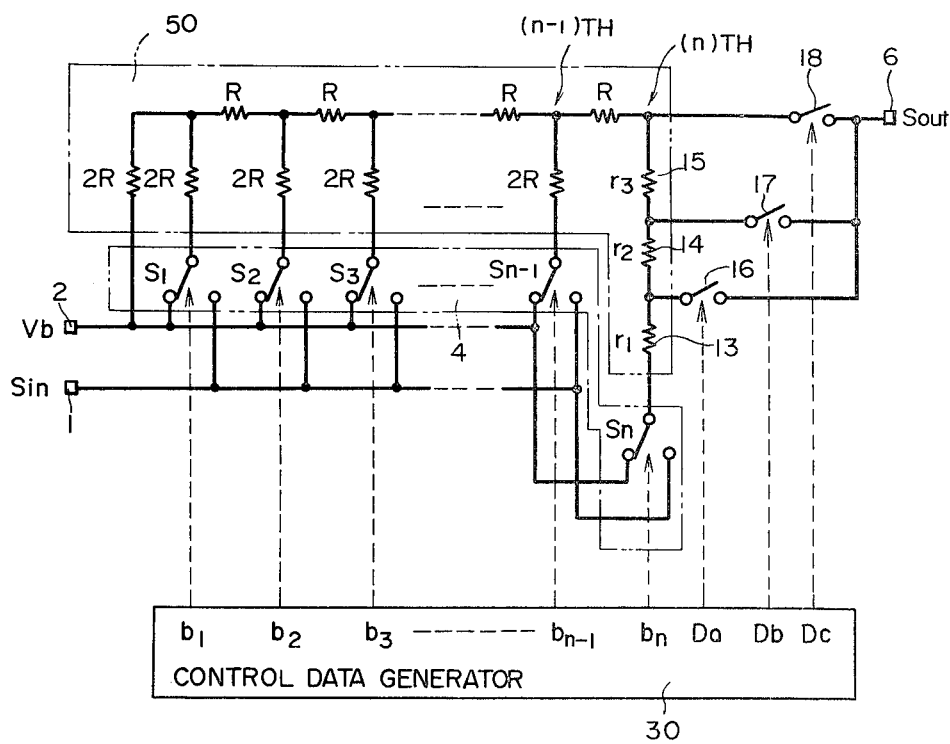
FIG. 12 is a schematic diagram of a further embodiment of the present invention.

FIG. 12 is a schematic diagram showing a further embodiment of the present invention. In particular, the embodiment shown comprises a signal attenuator adapted to be capable of decreasing the output impedance as the attenuation amount increases and of charging a gradient of the output/input with respect to step numbers of the control data, thereby to make it possible to approximate the attenuation characteristic to an arbitrary curve in a polygonal line manner. The FIG. 12 embodiment employs an R2R-type ladder resistor network as a ladder network 50. However, a series connection of these resistors 13, 14 and 15 is utilized as an input resistor of the final stage ladder portion. One end of the series connection of these resistors 13, 14 and 15 is connected as a signal input terminal to a switch $S_n$ and the other end of the series connection is connected to the output resistor. The respective junctions of these resistors 13, 14, 15 and the output resistor are connected through the switches 16, 17 and 18 in parallel to the output terminal 6. The switches 16, 17 and 18 are turned on or off as a function of the control data Da, Db and Dc obtained from the control data generator 30. The sum of the respective resistance values R1, R2 and R3 of the resistors 13, 14 and 15 is selected to be 2R, for example.

Figure 13:
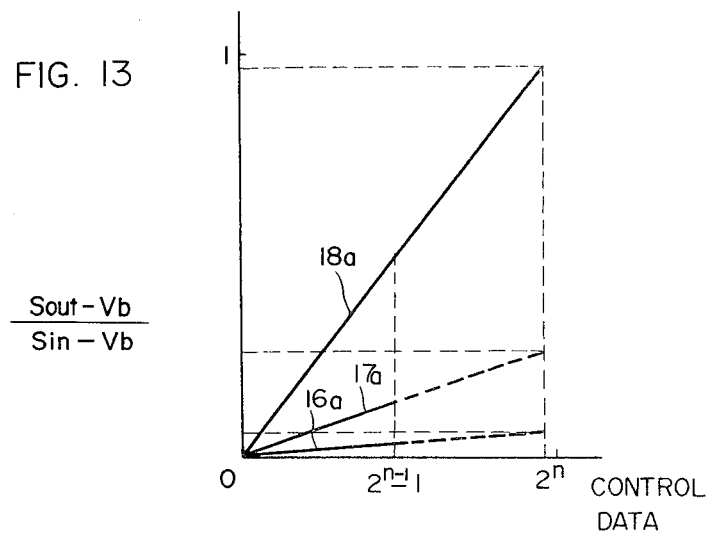
FIG. 13 is a graph showing one example of a signal attenuation characteristic for explaining the FIG. 12 embodiment.

In the case where the switch 16, 17 or 18 is solely turned on in the FIG. 12 embodiment, the ratio of the output to the input (Sout−Vb)/(Sin−Vb) exhibits a gradient as shown as line 16a, 17a or 18a as shown in FIG. 13 in accordance with a change of the control data. The gradients of the lines 16a and 17a are r1/4R and (r1+r2)/4R, respectively, in the period where the control data changes from 0 to $2^{n-1}-1$ and the gradient of the line 18a is ½ in the same period because of the relation r1+r2+r3=2R. However, when the control data changes from $2^{n-1}-1$ to $2^{n-1}$, an abrupt change of the gradient of the lines 16a and 17a occurs as shown in FIG. 6, as is the same as described in conjunction with the previous embodiments. Therefore, the FIG. 12 embodiment is adapted to attain an attenuation characteristic approximated in a polygonal line manner as shown in FIG. 14, for example, through proper combination of different gradient lines.

Figure 14:
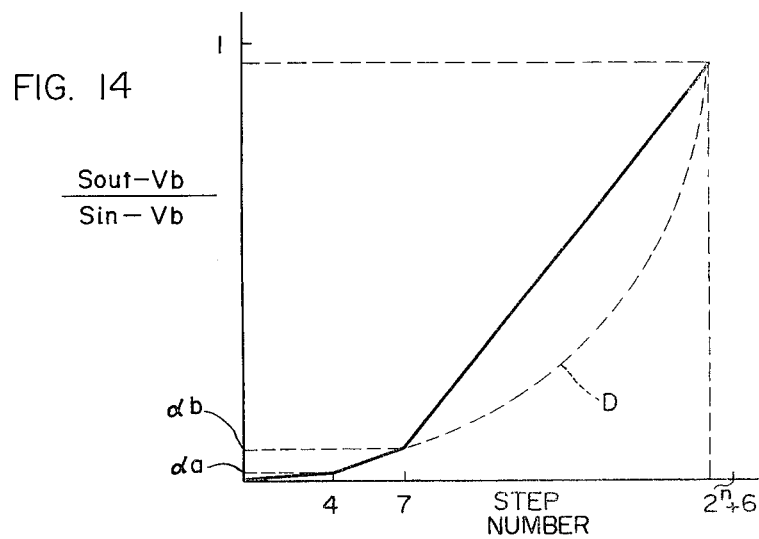
FIG. 14 is a graph showing one example of a signal attenuation characteristic for achieving polygonal line approximation of a desired curve in accordance with the FIG. 12 embodiment.

FIG. 14 shows a case in which D-curve (FIG. 3B) is attained in a polygonal line approximation manner. The bending points are determined first based on D-curve and the ratio (Sout−Vb)/(Sin−Vb) at that bending points are determined as $\alpha a$ and $\alpha b$, respectively. Then, the step numbers of the control data may be determined in conjunction with values of $\alpha a$ and $\alpha b$ as evaluated above. Thus, the ratio (Sout−Vb)/(Sin−Vb) at the bending points and the corresponding step numbers are determined and, therefore, the gradients of the lines 16a and 17a in FIG. 13 are decided. As a result, the resistance value r1, r2 and r3 of the resistors 13, 14 and 15 are determined.

Assuming that the resistance value r1, r2 and r3 are selected to have R/8, 3R/8 and 3R/2 and that the step numbers corresponding to $\alpha a$ and $\alpha b$ are selected to have values of 4 and 7, in order to make polygonal line approximation to D-curve by employing FIG. 12 embodiment, only the switch 16 is turned on by the control data Da and the control data $b_1$ to $b_n$ is changed from 0 to 3 in order for the portion from zero to the third step, whereby the ratio of the output to the input is changed along the line 16a for that portion. Then, only the switch 17 is turned on by the control data Db, and the value of the control data is changed into the value being $\alpha a$ or $\alpha b$ approximately on the line 17a (FIG. 14), i.e. 1. At the same time, the control data $b_1$ to $b_n$ is changed from 1 to 3 for the portion from the fourth to the sixth step in order, whereby the ratio is changed along the line 17a for that portion. Thereafter, only the switch 18 is turned on by the control data Dc and the value of the control data is changed into the value being $\alpha b$ or $\alpha a$ approximately on the line 18a (FIG. 14), i.e. 1. For the portion exceeding the seventh step, the control data $b_1$ or $b_n$ is changed from 1 to $2^{n-1}-1$ in order, whereby the ratio is changed along the line 18a.

Thus, the control data $b_1, b_2, \ldots b_n$ and Da, Db and Dc are generated from the control data generator 30 in accordance with an increase of the step numbers as shown in Table II.

TABLE II

| step number | value control data $b_1, b_2 \ldots b_n$ | control data Da, Db or Dc being selected as "1" |
|---|---|---|
| 0 | 0 | — |
| 1 | 1 | Da |
| 2 | 2 | Da |
| 3 | 3 | Da |
| 4 | 1 | Db |
| 5 | 2 | Db |
| 6 | 3 | Db |
| 7 | 1 | Dc |
| 8 | 2 | Dc |
| . | . | . |
| . | . | . |
| . | . | . |
| $2^n + 5$ | $2^n - 1$ | Dc |

Thus, for the portion from zero to the third step the ratio (Sout−Vb)/(Sin−Vb) is changed at the pitch of $1/2^n \times 16$, for the portion from the fourth to the sixth step the ratio is changed at the pitch of $1/2^n \times 4$, and for the portion exceeding the seventh step the ratio is changed at the pitch of $1/2^n$, whereby a polygonal line approximation of D-curve (FIG. 3B) can be attained as shown in FIG. 14.

Since the composite resistance value up to the (n−1) stage is R in the FIG. 12 embodiment, the output impedance $R_{03}$, $R_{02}$ or $R_{01}$ when the switch 16, 17 or 18 is solely turned on is expressed by the following equation (5), (6) or (7), respectively.

$$R_{03} = \frac{(2R + r3 + r2)r1}{(2R + r3 + r2) + r1} = \frac{(2R + r3 + r2)r1}{4R} \quad (5)$$

$$R_{02} = \frac{(2R + r3)(r2 + r1)}{(2R + r3) + (r2 + r1)} = \frac{(2R + r3)(r2 + r1)}{4R} \quad (6)$$

$$R_{01} = \frac{2R(r3 + r2 + r1)}{2R + (r3 + r2 + r1)} = \frac{2R(r3 + r2 + r1)}{4R} = R \quad (7)$$

Since the relation $R_{03} - R_{02} = -(r2+2r3)r2/4R < 0$ is established while the equations (5) and (6) are utilized and the relation $R_{02} - R_{01} = -r3^2/4R < 0$ is established while the equations (6) and (7) are utilized, the relation $R_{03} < R_{02} < R_{01}$ is established.

Thus, it is adapted such that when the attenuation amount is large the switch 16 is turned on and, as the attenuation amount decreases, the switch 17 or 18 is turned on in succession, then it is possible to decrease the output impedance as the attenuation amount increases.

By way of an example, assuming that the resistance values R1, R2 and R3 are R/8, 3R/8 and 3R/2, respectively, then the output impedances $R_{03}$, $R_{02}$ and $R_{01}$ may be expressed as follows:

$$R_{03} = \{(1/8) - (1/256)\}R$$
$$= 0.1211R$$
$$R_{02} = \{(1/2) - (1/16)\}R$$
$$= 0.4375R$$
$$R_{01} = R$$

Figure 15:
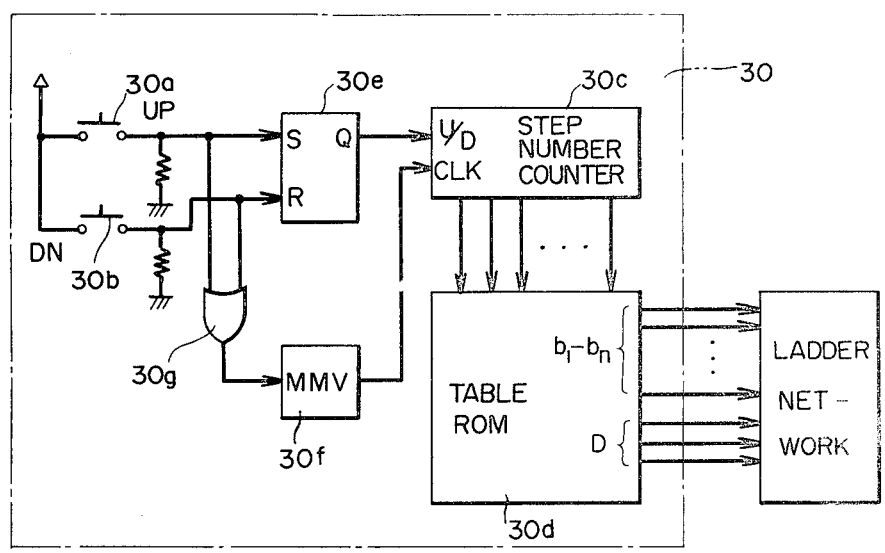
FIG. 15 is a block diagram showing one example of the control data generator.

FIG. 15 is a block diagram showing one example of the control data generator 30. The control generator 30 comprises two key switches 30a and 30b which are coupled to a set terminal and a reset terminal of a flip-flop 30e an output of which is coupled to an up-down designation terminal U/D of a step number counter 30c. The switches 30a and 30b are coupled to a monostable multivibrator 30f through an OR gate 30g and an output of the monostable multivibrator 30f is connected to a clock terminal CLK of the step number counter 30c. Accordingly, each time the switch 30a is operated, the step number counter 30c is incremented, while each time the switch 30b is operated the counter 30c is decremented. The content in the switch number counter 30c is applied to an input of a table read only memory or a decoder 30d. The table read only memory 30d is stored with the table data as shown in TABLE II described previously and the control data $b_1$ to $b_n$ and Da, Db and Dc obtained therefrom is applied to the ladder network.

Meanwhile, the FIG. 4 embodiment may be structured such that the output of the step number counter 30c is as such applied to the ladder network as the output from the control data generator 30.

A polygonal line approximation shown in FIG. 14 by the use of the FIG. 12 embodiment is merely by way of an example and any curve can be approximated as a matter of course. Accordingly, the number of the input resistors of the final stage ladder portion (three in the embodiment) is also merely by way of an example and may be increased or decreased as appropriate.

Meanwhile, in the above description in conjunction with FIG. 12 embodiment, the resistance value of the output resistor of the final stage ladder portion is selected to have R and the sum of resistance values of a plurality of resistors constituting the input resistor of the final stage is selected to have 2R; however, in the case where the ladder network is used for a portion excluding a portion where the ratio output/input is changed abruptly, it is not necessary to select the resistance value of the output resistor to have R and the sum of the resistance values of the plurality of resistors included in the input resistor to have 2R. If the resistance values are not selected to be R and 2R, various gradients of the lines 16a, 17a and 18a may be obtained in FIG. 13.

Furthermore, the input resistor of the final stage ladder portion may be comprised of a plurality of resistors 19', 20- and 21' connected in parallel, in which the respective resistor has one end connected to the switch $S_n$ and the other end connected to the signal output terminal 6. In such case, switches 23', 24' and 25' may be interposed between the respective one end of the resistors and the switch $S_n$ or signal output terminal 6, and these switches 23', 24' and 25' may be controlled by the control data Da, Db and Dc, respectively.

Figure 16:
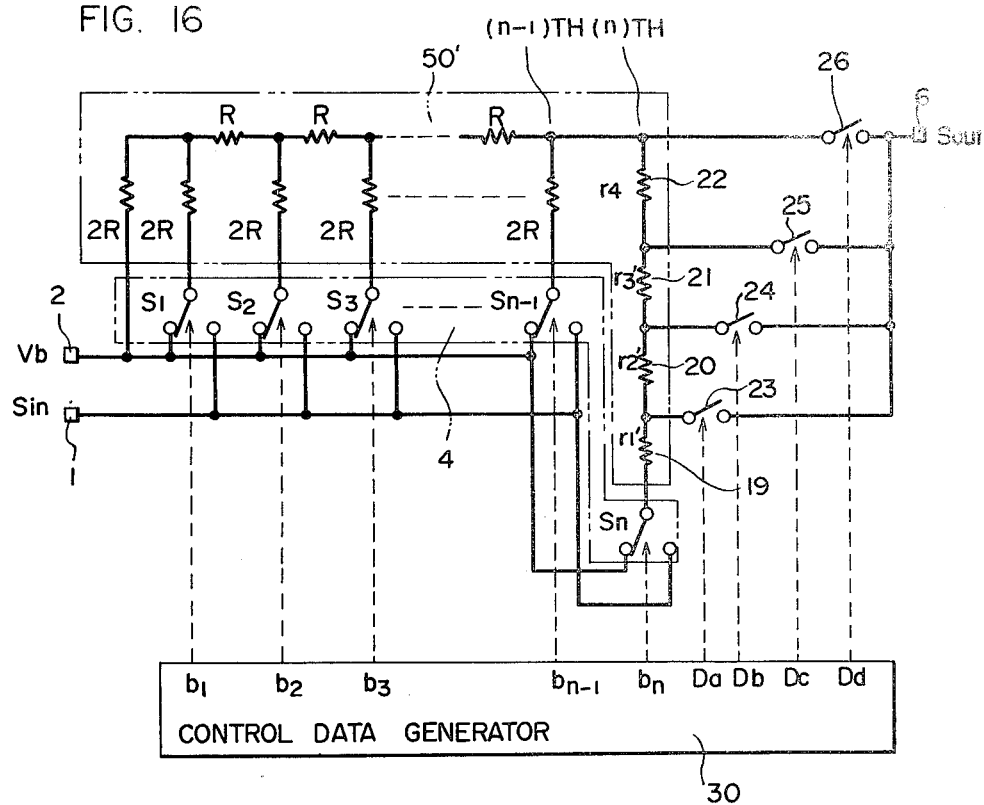
FIG. 16 is a schematic diagram showing still a further embodiment of the present invention.

FIG. 16 is a schematic diagram of a further embodiment of the present invention. The FIG. 16 embodiment is adapted to achieve a more accurate polygonal line approximation through combination of the FIG. 4 embodiment and the FIG. 12 embodiment. Referring to FIG. 16, the final stage ladder portion of the ladder network 50 is implemented as a series connection of the resistors 19, 20, 21 and 22. The resistors 19, 20 and 21 correspond to the resistors 12, 14 and 15, respectively, of the FIG. 12 embodiment, and the resistor 22 corresponds to the resistor 7 of the FIG. 4 embodiment. These resistors 19, 20 and 21 are selected to have the resistance values r1', r2' and r3', respectively, and the sum of these is not 2R, and the resistor 22 is selected to have the resistance value r4' but not R. The switch $S_n$ is connected to one end of the series connection of these resistors 19 to 22 and the other end of the series connection is connected to the output of the preceding stage (n−1)th ladder portion. The switches 23, 24 and 25 are connected in parallel between the respective junctions of the series connection of these resistors 19 to 22 and the output terminal 6 and the switch 26 is interposed between the junction of the resistor 22 and the preceding stage ladder portion and the output terminal 6. The switches 23, 24 and 25 are turned on or off responsive to the control data Da, Db and Dc and the switch 26 is turned on or off responsive to the control data Dd. The control data Dd is obtained as "1" when the final bit $b_n$ of the control data is "1". Any one of the control data Da, Db and Dc is selectively obtained as "1" in accordance with the previously described TABLE II.

Figure 17:
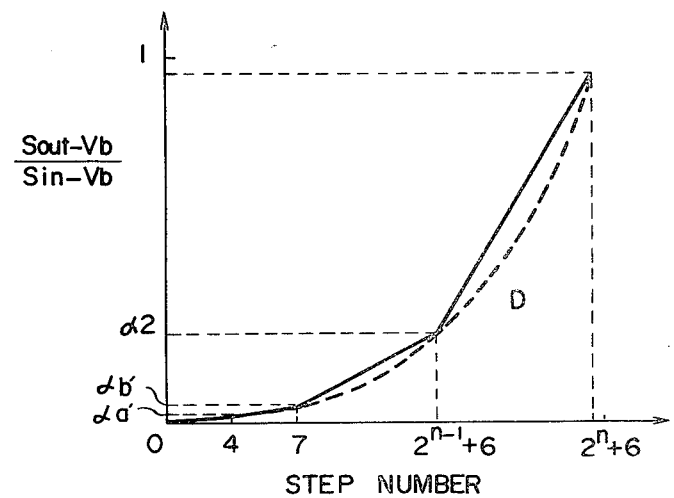
FIG. 17 is a graph showing one example of a signal attenuation characteristic for achieving polygonal line approximation of a desired curve in accordance with the FIG. 16 embodiment.

In order to achieve a polygonal line approximation as shown in FIG. 17 using the FIG. 16 embodiment, the bending point is determined first based on the curve to be intended to approximate in a polygonal line manner, i.e. D-curve, and the ratio (Sout−Vb)/(Sin−Vb) at that bending point, i.e. $\alpha a'$, $\alpha b'$ and $\alpha 2$ may be determined. Then, since the step numbers from step number corresponding to $\alpha 2$ to step number at the end of D-curve, i.e. $2^n+5$ amounts to $2^{n-1}-1$, the step numbers corresponding to $\alpha a'$, $\alpha b'$ and $\alpha 2$ may be determined accordingly. Thereafter, the resistance values r1', r2', r3' and r4' of the resistors 19', 20', 21' and 22' are determined based on the values of $\alpha a'$, $\alpha b'$ and $\alpha 2$ and the step numbers corresponding thereto by using the previous equations (3) and (4) and (3') or (4').

Assuming that the step numbers corresponding to $\alpha a'$, $\alpha b'$ and $\alpha 2$ are selected to be values of 4, 7 and $2^{n-1}+6$, respectively, and that the resistance values of the resistors r1', r2', r3' and r4' are selected to have R/8, 3R/8, 3R/2 and 3R, respectively, in order to achieve a polygonal line approximation as shown in FIG. 17 using the FIG. 16 embodiment, the control data $b_1$ to $b_n$ and Da, Db, Dc and Dd is changed responsive to an increase of the step numbers and in accordance with the data shown in TABLE III.

TABLE III

| step number | value of control data | | | | | | control data Da, Db, or Dc being selected as "1" |
|---|---|---|---|---|---|---|---|
| | $b_1$ | $b_2$ | $b_3$ | ... | $b_{n-1}$ | $b_n$ | |
| 0 | 0 | 0 | 0 | ... | 0 | 0 | — |
| 1 | 1 | 0 | 0 | ... | 0 | 0 | Da |
| 2 | 0 | 1 | 0 | ... | 0 | 0 | Da |
| 3 | 1 | 1 | 0 | ... | 0 | 0 | Da |
| 4 | 1 | 0 | 0 | ... | 0 | 0 | Db |
| 5 | 0 | 1 | 0 | ... | 0 | 0 | Db |
| 6 | 1 | 1 | 0 | ... | 0 | 0 | Db |
| 7 | 1 | 0 | 0 | ... | 0 | 0 | Dc |
| 8 | 0 | 1 | 0 | ... | 0 | 0 | Dc |
| 9 | 1 | 1 | 0 | ... | 0 | 0 | Dc |
| . | | | | | | | |
| . | | | | | | | |
| $2^{n-1}+5$ | 1 | 1 | 1 | ... | 1 | 0 | Dc |
| $2^{n-1}+6$ | 0 | 0 | 0 | ... | 0 | 1 | Dc, Dd |
| . | | | | | | | |
| . | | | | | | | |
| $2^n+5$ | 1 | 1 | 1 | ... | 1 | 1 | Dc, Dd |

Meanwhile, since the operation of the FIG. 16 embodiment will be readily understood with reference to the previous description in conjunction with the FIG. 4 embodiment and the FIG. 12 embodiment and with simultaneous reference to the previously described TABLE III, a more detailed description will be omitted.

Briefly described, the switch 23 is turned on from the zero to the third step, and accordingly a series connection (r2'+r3'+r4) of the resistors 20, 21 and 22 is utilized as the output resistor (RA) of the final stage ladder portion and the resistor 19 (r1') is utilized as the input resistor (RB). Only the switch 24 is turned on from the fourth step to the sixth step and a series connection (r3'+r4) of the resistors 21 and 22 is utilized as the output resistor (RA) of the ladder portion and a series connection (r1'+r2') of the resistors 19 and 20 is utilized as the input resistor (RB). Only the switch 25 is turned on from the seventh step to ($2^{n-1}+5$)th step and the resistor 22 (r4) is utilized as the output resistor (RA) of the final stage ladder portion while a series connection (r1'+r2'+r3') of the resistors 19, 20 and 21 is utilized as the input resistor (RB). The switches 25 and 26 are simultaneously turned on from the step $2^{n-1}+6$ to the step $2^n$ and the output resistor (RA) of the final stage ladder portion becomes 0 and a series connection (r1'+r2'+r3') of the resistors 19, 20 and 21 is utilized as the input resistor (RB). In the state of turning on of the switches 23, 24, 25 and 26, the control data $b_1$ to $b_n$ is changed in order as in FIG. 12 embodiment, while the control data is changed into a specific value abruptly when the switches 23, 24 and 25 are turned on, as shown in TABLE III. Thus, as shown in FIG. 17 a more accurate polygonal line approximation can be attained with respect to D-curve.

The respective resistance values r1', r2', r3' and r4' of a plurality of resistors 19', 20', 21' and 22' coupled in series may be modified, and in such case, the respective switches 23, 24, 25 and 26 are sequentially turned on alone and any one or more of the four switches, e.g. only switch 24 is turned on or off again in response to the final bit of the control data.

Figure 3A:
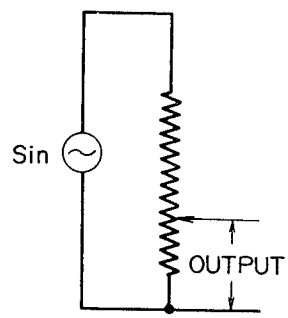
FIG. 3A is a schematic diagram of one example of a conventional variable resistor-type signal attenuator.
Figure 3B:
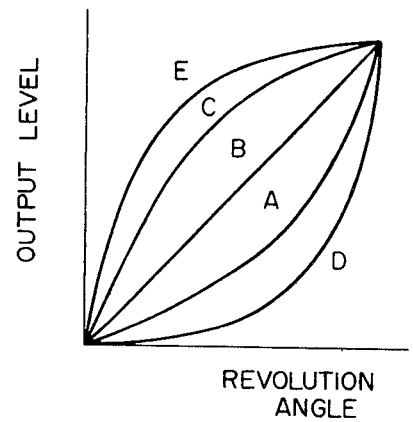
FIG. 3B is a graph showing a curve of a signal attenuation characteristic of the FIG. 3A attenuator.

Meanwhile, by making a slight change to any of the previously described embodiments, not only a polygonal line approximation to A-curve or D-curve shown in FIG. 3B but also a polygonal line approximation to C-curve and E-curve can also be attained in substantially the same manner.

Figure 18:
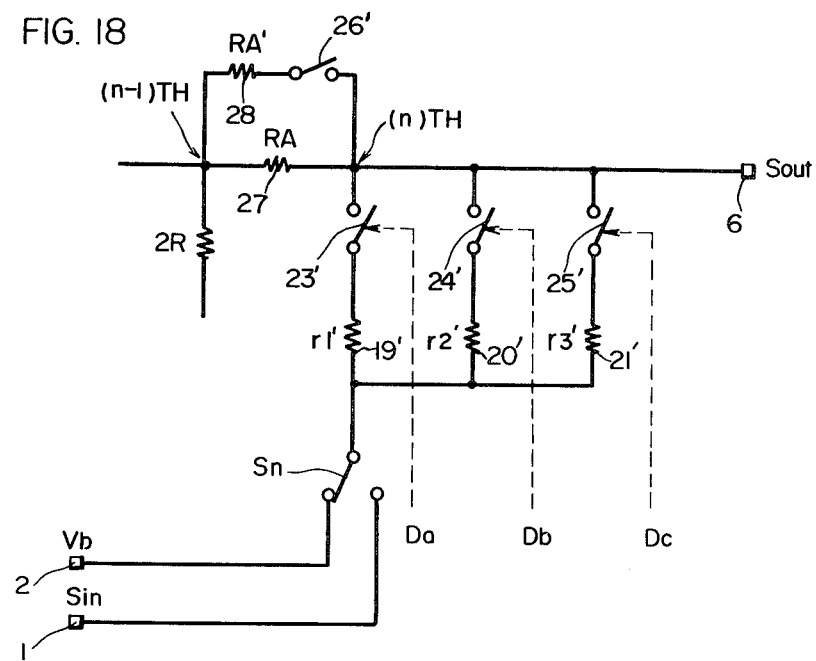
FIG. 18 is a schematic diagram of another embodiment of the present invention.

FIG. 18 is a schematic diagram showing a modification of the FIG. 16 embodiment. The embodiment shown employs the resistors 19', 20' and 21' coupled in parallel, as the input resistor of the final stage ladder portion, in which the resistors 19', 20' and 21' are selected to have the resistance values r1', r2' and r3', respectively. One end of each of the resistors 19', 20' and 21' is commonly connected to the switch $S_n$. The other end of each of the resistors 19', 20' and 21' is commonly connected through each of the switches 23', 24' and 25', respectively, to the output terminal 6. The resistor 27 and the resistor 28 connected in parallel through the switch 26' to the resistor 27 are employed as the output resistor of the final stage ladder portion. In the embodiment shown, the resistance values of the resistors 19', 20' and 21' are selected to be in a relation of r1'>r2'>r3'. The switches 23', 24' and 25' are turned on or off responsive to the control data Da, Db and Dc, respectively, obtained from the control data generator 30 (FIG. 16). The switch 26' is turned on or off responsive to the control data Dd.

When the control data DA becomes "1" and the switch 23' is turned on, the resistor 19'(r1') is rendered effective as the input resistor (RB) of the final stage ladder portion. Similarly, when the switch 24' or 25' is turned on, the resistor 20' (r2') or the resistor 21' (r3') is rendered effective as the input resistor (RB) of the final stage ladder portion. The switch 26' is turned off while the final bit $b_n$ of the control data $b_1, b^2, \ldots b_n$ is "O", and when the final bit $b_n$ becomes "1", the switch 26' is turned on, whereby a parallel connection of the resistors 27 and 28 is rendered effective as the output resistor (RA) of the final stage ladder portion. Thus, polygonal line approximation to A-curve or D-curve is achieved.

The FIG. 18 embodiment may be modified such that the switches 23', 24' and 25' are initially all turned on and thereafter the switch 23' is turned off, whereupon the switch 24' is turned off, by changing the control data accordingly, is such case, it is necessary to change the resistance values r1', r2' and r3' of the resistors 19', 20' and 21' correspondingly.

Furthermore, by modifying the resistance values r1', r2' and r3' of the resistors 19', 20' and 21', it is possible to eliminate the resistor 28 and the switch 26', in which case any one or more of the three switches 23', 24' and 25' may be turned on or off in response to the final bit of the control data.

Figure 1:
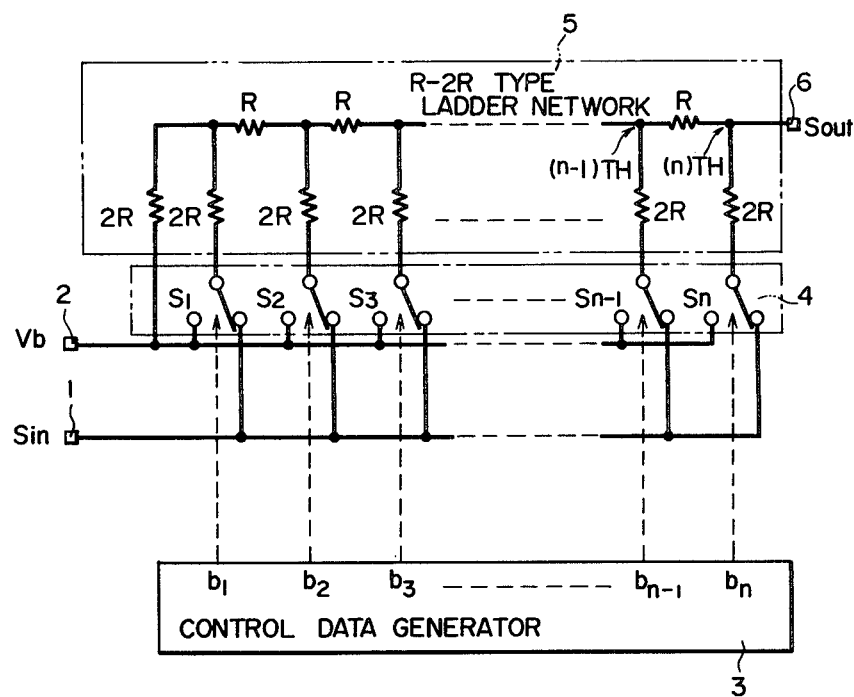
FIG. 1 is a schematic diagram of one example of a signal attenuator employing a conventional R-2R-type ladder resistor network which constitutes the background of the present invention.
Figure 2:
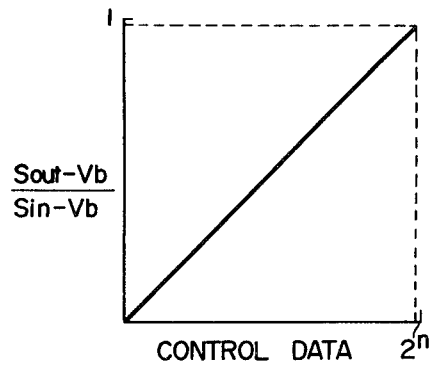
FIG. 2 is a graph showing a signal attenuation characteristic of the FIG. 1 conventional example.
Figure 19:
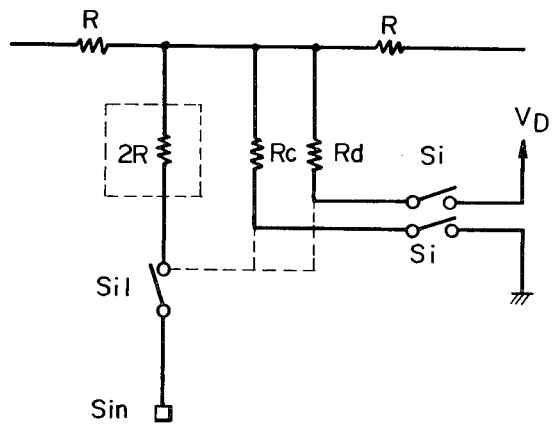
FIG. 19 is a schematic diagram showing a major portion of another implementation of the ladder circuit.

Meanwhile, generally the R-2R-type ladder resistor network is structured as shown in a block 5 of FIG. 1, in which the predetermined voltage Vb or the input signal Sin is applied thereto through the switch circuit 4; however, the subject matter of the present application would not be changed even if the structure is modified as shown in FIG. 19. More specifically, in FIG. 19 embodiment, two resistors Rc and Rd having the resistance values a sum of which is selected to be 2R are connected in parallel with the input resistor 2R, the resistor Rc is connected to the ground potential by a switch $S_{i3}$, and the resistor Rd is supplied with a predetermined voltage $V_D$ by coupling the resistor Rd to the voltage Vd through a switch $S_{i2}$. The switches $S_{i2}$ and $S_{i3}$ are coupled in a ganged fashion and the switch $S_{i1}$ is turned on or off when both switches $S_{i2}$ and $S_{i3}$ are turned on or off by the control data $b_1$ to $b_n$.

In FIG. 19 embodiment, by eliminating the input resistor 2R, the input signal Sin may be applied to through the resistors Rc and Rd.

Meanwhile, the present invention may be also applied to not only such a signal attenuator as the FIG. 4 embodiment in which the analog input signal Sin is applied to the input terminal 1 and the bias voltage Vb is applied to the input terminal 2, but also to a signal attenuator in which the input terminal 2 is connected to the ground potential and the input terminal 1 is supplied with a reference voltage. The switches $S_1, S_2, \ldots S_n$ and the switches 9, 10, 11 and 12 of the switch circuits may be implemented by analog switches. Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A ladder-type signal attenuator, comprising:

A ladder network (50) including an R-2R-type resistor ladder circuit of a plurality of stages (n-1) each having an input resistor (2R) and an output resistor (R), and a ladder portion of the final stage (n) having an input resistor (8) and an output resistor (7) and coupled in a cascade fashion to said R-2R-type resistor ladder circuit, at least one of said input resistor (8) and said output resistor (7) of said final stage ladder portion being selected to have a resistance value (RB, RA) which is different from the resistance value (2R, R) of the corresponding one of the input resistor and the output resistor of the preceding stage, each stage (1 to n) of said ladder network (50) having a signal input terminal, a signal output terminal (6) for withdrawing an output signal (Sout) from said ladder network (50), means (2) for providing a predetermined potential (Vb) to said ladder network (50), means (1) for providing an input signal (Sin) to said ladder network (50), first control data providing means (3, 30) for providing first control data of a plurality of bits ($b_1$ to $b_n$) changeable in a predetermined manner, including a first bit ($b_1$) to a final bit b(n) each corresponding to one said stages (1 to n) respectively, and each of said bits having first and second states, input switch means ($S_1$ to $S_n$) responsive to the states of each bit ($b_1$ to $b_n$) of said first control data for selectively providing a corresponding signal input terminal with said pre-determined potential (Vb) or said input signal (Sin), and first resistance value changing means (9:10:11:12) responsive to the states of the final bit ($b_n$) of said first control data for changing the resistance value (RA, RB) of at least one of said input resistor (8) and said output resistor (7) of said final stage ladder portion.

2. A ladder-type signal attenuator in accordance with claim 1, wherein
said input resistor of said final stage ladder portion comprises two resistors (81, 82), and
said first resistance value changing means comprises switch means (9) responsive to the states of said final bit ($b_n$) of said first control data for selectively rendering effective either of said two resistors (81, 82).

3. A ladder-type signal attenuator in accordance with claim 1, wherein
said output resistor of said final stage ladder portion comprises two resistors (71, 72), and
said first resistance value changing means comprises switch means (10) responsive to the states of said final bit ($b_n$) of said first control data for selectively rendering effective either of said two resistors (71, 72).

4. A ladder-type signal attenuator in accordance with claim 1, wherein
said output resistor of said final stage ladder portion comprises two resistors (71, 72') each having one end thereof commonly coupled, and
said first resistance value changing means comprises switch means (11) responsive to the states of said final bit ($b_n$) of said first control data for connecting in parallel said two resistors (71, 72').

5. A ladder-type signal attenuator in accordance with claim 1, wherein
said output resistor and said input resistor of said final stage ladder portion comprise three resistors (7', 8' and 78) connected in series, and
said first resistance value changing means comprises switch means (12) coupled in parallel with one (78) of said three resistors and responsive to the states of said final bit ($b_n$) of said first control data for selectively rendering effective said resistor (78).

6. A ladder-type signal attenuator in accordance with any one of the preceding claims 1 to 5, which further comprises
second resistance value changing means (23, 24, 25:23', 24', 25') for changing the resistance value (RA, RB) of at least one of said input resistor (8) and said output resistor (7) of said final stage ladder portion when the final bit ($b_n$) of said first control data is unchanged in the first state or the second state, and
control data controlling means (30) for providing second control data (Da, Db, Dc) for controlling said second resistance value changing means and for altering said predetermined manner of change of said first control data ($b_1$ to $b_n$) when the second control data changes
whereby the ratio of the output to the input of said ladder network (50) with respect to the change of said first control data is a substantially polyganal line approximating a predetermined curve.

7. A ladder-type signal attenuator in accordance with claim 6, wherein
said input resistor of said final stage ladder portion comprises a plurality of resistors (19, 20, 21, 22:19', 20', 21'), said second resistance value changing means comprises switch means (23, 24, 25:23', 24', 25') for selecting at least one of said plurality of resistors, and
said control data controlling means comprises means (30) for providing said second control data (Da, Db, Dc) for turning on or off each said switch means (23, 24, 25:23', 24', 25').

8. A ladder-type signal attenuator in accordance with claim 7, wherein
said input resistor of said final stage ladder portion comprises a plurality of resistors (19, 20, 21, 22) connected in series,
said second resistance value changing means comprises switch means (23, 24, 25) interposed in parallel between the respective one end of said plurality of resistors (19, 20, 21) and said output terminal (6), and
said control data controlling means comprises means (30) for providing said second control data (Da, Db, Dc) for turning on or off each said switch means (23, 24, 25).

9. A ladder-type signal attenuator in accordance with claim 7, wherein
said input resistor of said final stage ladder portion comprises a plurality of resistors (19', 20', 21') coupled in parallel, one end of each said plurality of resistors being connected commonly to said signal input terminal and the other end of each said plurality of resistors being connected commonly to said signal output terminal (6), and
said second resistance value changing means comprises switch means (23', 24', 25') interposed in series between one end of each said plurality of resistors and said signal input terminal or said signal output terminal (6), and
said control data controlling means comprises means (30) for providing said second control data (Da, Db, Dc) for turning on or off each said means (23', 24', 25').

10. A ladder-type signal attenuator in accordance with claim 8, wherein
said first resistance value changing means comprises one or more switch means (26) interposed in parallel between one end of each said plurality of resistors (19, 20, 21, 22) and said signal output terminal (6), said switch means (26) being turned on or off according to the state of the final bit ($b_n$) of said first control data.

11. A ladder-type signal attenuator in accordance with claim 9, wherein
said first resistance value changing means comprises one or more switch means interposed in series between one end of each said plurality of resistors (19', 20', 21') and said signal input terminal or said signal output terminal (6), said one or more switch means being turned on or off according to the state of the final bit ($b_n$) of said first control data.

12. A ladder-type signal attenuator in accordance with claim 10, wherein
said one or more switch means included in said first resistance value changing means and said switch means (23, 24, 25:23', 24', 25') included in said second resistance value changing means comprises one or more common switches.

13. A ladder-type signal attenuator in accordance with claim 11, wherein said one or more switch means included in said first resistance value changing means and said switch means (23, 24, 25:23′, 24′, 25′) included in said resistance value changing means comprises one or more common switches.

14. A ladder-type signal attenuator, comprises:
a ladder network (50) including R-2R-type resistor ladder circuit of a plurality of stages (n-1) each having an input resistor (2R) and an output resistor (R), and a ladden portion of the final stage (n) having an input resistor and an output resistor coupled in a cascade fashion to said R-2R-type resistor ladder circuit,
each stage (1 to n) of said ladder network (50) having a signal input terminal,
a signal output terminal (6) for withdrawing an output signal (Sout) from said ladder network (50),
means (2) for providing a predetermined potential (Vb) to said ladder network (50),
means (1) for providing an input signal (Sin) to said ladder network (50),
first control data providing means (30) for providing first control data of a plurality of bits ($b_1$ to $b_n$), the bits including a first bit ($b_1$) to a final bit ($b_n$) each corresponding to one of the stages (1 to n) respectively, and each of the bits having first and second states,
input switch means ($S_1$ to $S_n$) responsive to the states of each bit ($b_1$ to $b_n$) of said first control data for selectively prividing to the corresponding signal input terminal with said predetermined potential (Vb) or said input signal (Sin),
resistance value changing means (16, 17, 18:23, 24, 25:23′, 24′, 25′) for changing the resistance value (RA, RB) of at least one of said input resistor and said output resistor of said final stage ladder portion when the state of the final bit ($b_n$) of said first control data being unchanged in the first state or the second state, and
control data controlling means (30) for providing a second control data (Da, Db, Dc) for controlling said resistance value changing means and for altering said predetermined change of said first control data ($b_1$ to $b_n$) when the second control data is changed, whereby
a gradient of the ratio of the output to the input of said ladder network (50) with respect to step numbers of said first control data being changed in accordance with an increase of steps of said first control data.

15. A ladder-type signal attenuator in accordance with claim 14, wherein
said input resistor of said final stage ladder portion comprises a plurality of resistors (13, 14, 15:19, 20, 21, 22) connected in series,
said resistance value changing means comprises switch means (16, 17, 18:23, 24, 25) interposed in parallel between one end of each said plurality of resistors and said signal output terminal (6), and
said control data controlling means comprises means (30) for providing said second control data (Da, Db, Dc) for turning on or off each said switch means (16, 17, 18:23, 24, 25).

16. A ladder-type signal attenuator in accordance with claim 14, wherein
said input resistor of said final stage ladder portion comprises a plurality of resistors (19′, 20′, 21′) coupled in parallel and each having one end connected commonly to said signal input terminal and other end commonly connected to said signal output terminal (6),
said resistance value changing means comprises switch means (23′, 24′, 25′) interposed in series between one end of each said plurality or resistors and said signal input terminal or said signal output terminal (6),
said control data controlling means comprises means (30) for providing said second control data (Da, Db, Dc) for turning on or off each said switch means (23′, 24′, 25′).

17. A ladder-type signal attenuator in accordance with claim 15, wherein
said input resistor of said final stage ladder portion comprises a plurality of resistors (13, 14, 15) connected in series and having 2R of composite resistance value thereof, and
said output resistor of said final stage ladder portion has resistance value of R.

* * * * *